United States Patent [19]
Huang et al.

[11] Patent Number: 5,541,594
[45] Date of Patent: Jul. 30, 1996

[54] FIXED QUALITY SOURCE CODER WITH FIXED THRESHOLD

[75] Inventors: Chien-Min Huang; Richard W. Harris, both of Logan; Paul D. Israelsen, North Logan, all of Utah

[73] Assignee: Utah State University Foundation, North Logan, Utah

[21] Appl. No.: 274,622

[22] Filed: Jul. 13, 1994

Related U.S. Application Data

[63] Continuation-in-part of Ser. No. 218,601, Mar. 28, 1994, abandoned.

[51] Int. Cl.$^6$ ........................................... H03M 7/30
[52] U.S. Cl. ................................. 341/51; 348/414
[58] Field of Search ............................ 341/51, 67, 76, 341/106; 348/414, 417, 418, 422

[56] References Cited

U.S. PATENT DOCUMENTS

| | | |
|---|---|---|
| 4,560,977 | 12/1985 | Murakami et al. . |
| 4,639,778 | 1/1987 | Yamaguchi et al. . |
| 4,652,905 | 3/1987 | Lippel . |
| 4,670,851 | 6/1987 | Murakami et al. . |
| 4,710,812 | 12/1987 | Murakami et al. . |
| 4,772,946 | 9/1988 | Hammer . |
| 4,903,317 | 2/1990 | Nishihara et al. . |
| 4,933,762 | 6/1990 | Guichard et al. . |
| 4,943,855 | 7/1990 | Bheda et al. . |
| 4,958,225 | 9/1990 | Bi et al. . |
| 5,031,037 | 7/1991 | Israelsen . |
| 5,124,791 | 6/1992 | Israelsen et al. . |
| 5,172,228 | 12/1992 | Israelsen . |
| 5,194,950 | 3/1993 | Murakami et al. ............. 358/133 |
| 5,204,899 | 4/1993 | Israelsen et al. . |
| 5,235,418 | 8/1993 | Lucas ............................ 358/133 |
| 5,371,544 | 12/1994 | Jacquin et al. ................. 348/422 |

OTHER PUBLICATIONS

Patent Application Ser. No. 08/180,010, filed Jan. 11, 1994, presently pending, entitled "Method & Apparatus for Data Compression with Reduced Distortion," inventors Richard W. Harris, Paul D. Israelsen, and Scott E. Budge. Note application is a continuation of 07/676,460 and 07/365,990.

Baker, R. L., "Vector Quantization of Digital Images," Doctoral Thesis, Stanford University (1984). (For copy see file 08/180,010).

(List continued on next page.)

*Primary Examiner*—Howard L. Williams
*Attorney, Agent, or Firm*—Trask, Britt & Rossa

[57] ABSTRACT

A fixed quality source coder receives and performs VQ on an input signal $I_D$. The signal $I_D$ may be characterized by the number of samples/frame and bits per sample, and may be provided by a traditional source coder. The traditional source coder may include a sample-and-hold (S/H) circuit producing rxs samples/frame and an ADC providing n bits per pixel. In a first embodiment, the number of bits/sample is increased. In the second embodiment, the number of samples/frame is increased. In a third embodiment, both the number of bits/sample and the number of samples/frame are increased. Measurements made in simulations involving the first and second embodiments show that the fixed quality source coder has a smaller data rate, mean absolute error (MAE) and root mean square error (RMSE) than that of the traditional source coder, while maintaining the same or less maximum error. The fixed quality source coder includes an encoder and may also include a decoder. The encoder may include a lossy codec that receives and encodes the signal $I_D$ to provide encoded information to a multiplexer regarding the signal $I_D$. The lossy codec also decodes the encoded signal to produce a decoded signal $I_{VQ}^{-1}$. A summer receives $I_D$ and $I_{VQ}^{-1}$ and determines an error signal $E_R$, where $E_R$ may equal $I_D\text{-}I_{VQ}^{-1}$. A threshold circuit receives the signal $E_R$ and passes a threshold signal $E_T$, where a threshold level T may be set to ensure that the maximum error allowed in the encoder is equal to a particular desired maximum error.

20 Claims, 14 Drawing Sheets

OTHER PUBLICATIONS

Jones, D. W., "Application of Splayed Trees to Data Compression," Communication of the ACM, vol. 31, No. 8, pp. 996–1007 (Aug. 1988). (For copy see file 08/180,010).

Storer, J. A., "Data Compression: Methods and Theory," Computer Science Press, pp. 39–128 (1988). (For copy see file 08/180,010).

Ziv, J. and Lempel, A., "A Universal Algorithm for Sequential Data Compression," IEEE Transactions on Information Theory, pp. 337–343 (Jun. 1976). (For copy see file 08/180, 010).

Ziv, J., "On Universal Quantization," IEEE Transactions on Information Theory, vol. IT–31, No. 3 (May 1985). (For copy see file 08/180,010).

Linde, Buzo and Gray, "An Algorithm for Vector Quantizer Design," IEEE Transactions On Communications, vol. Com–28. No. 1 (Jan. 1980).

Juang, B. H. and Gray, A. H., Jr., "Multiple Stage Vector Quantization for Speech Coding," ICASSP Proceedings, vol. 1:597–600, Apr. 1982.

Makhoul, J., Roucos, S., and Gish, H., "Vector Quantization in Speech Coding," IEEE Proceedings, vol. 73, No. 11, Nov. 1985, pp. 1551–1588.

Gray, R. M., "Vector Quantization," IEEE ASSP Magazine, Apr. 1984, pp. 4–29.

Elnahas, S. E., et al., "Progressive Coding and Transmission of Digital Diagnostic Pictures," IEEE Trans. on Medical Imaging, Vol. MI–5, No. 2, Jun. 1986, pp. 73–83.

Elnahas, S. E., "Data Compression With Application to Digital Radiology", Ph.D. Dissertation, Washington University, Sever Institute of Technology, Aug. 1984, pp. 56–68.

Venbrux, J., et al., "A VLSI Chip Set for High–Speed Lossless Data Compression," IEEE Transactions on Circuits and Systems For Video Technology, vol. 2, No. 4, Dec. 1992, pp. 381–391.

Wallace, G. K., "The JPEG Still Picture Compression Standard," IEEE Transactions on Consumer Electronics, vol. 38, No. 1, Feb. 1992, pp. xviii–xxxiv.

| BIT | TRUNCATION | | | ROUNDING | | |
|---|---|---|---|---|---|---|
| K = | $MAE_{SQ}$ | $RMSE_{SQ}$ | MAX $ERR_{SQ}$ | $MAE_{SQ}$ | $RMSE_{SQ}$ | MAX $ERR_{SQ}$ |
| 1 | 0.5 | 0.7 | 1.0 | 0.5 | 0.7 | 1.0 |
| 2 | 1.5 | 1.9 | 3.0 | 1.0 | 1.2 | 2.0 |
| 3 | 3.5 | 4.2 | 7.0 | 2.0 | 2.4 | 4.0 |
| 4 | 7.5 | 8.8 | 15.0 | 4.0 | 4.6 | 8.0 |
| 5 | 15.5 | 18.0 | 31.0 | 8.0 | 9.3 | 16.0 |
| 6 | 31.5 | 36.5 | 63.0 | 16.0 | 18.5 | 32.0 |

*Fig. 4*

| IMAGE | bpp | $MAE_{VQSC-I}$ | $RMSE_{VQSC-I}$ | $MAX\ ERR_{VQSC-I}$ |
|---|---|---|---|---|
| MR | 2.5 | 0.35 | 0.60 | 1.0 |
| | 1.8 | 0.60 | 0.90 | 2.0 |
| | 1.5 | 0.73 | 1.10 | 3.0 |
| | 1.2 | 0.94 | 1.42 | 4.0 |
| | 1.0 | 0.98 | 1.54 | 5.0 |
| | 0.9 | 1.13 | 1.75 | 6.0 |
| | 0.8 | 1.19 | 1.87 | 7.0 |
| DR | 4.4 | 0.34 | 0.58 | 1.0 |
| | 3.5 | 0.72 | 1.04 | 2.0 |
| | 2.9 | 0.99 | 1.38 | 3.0 |
| | 2.5 | 1.16 | 1.61 | 4.0 |
| | 2.3 | 1.26 | 1.75 | 5.0 |
| | 2.0 | 1.98 | 2.63 | 6.0 |
| | 1.7 | 2.18 | 2.89 | 7.0 |
| CT | 5.0 | 0.08 | 0.28 | 1.0 |
| | 4.8 | 0.23 | 0.62 | 2.0 |
| | 4.6 | 0.44 | 1.01 | 3.0 |
| | 4.3 | 0.71 | 1.44 | 4.0 |
| | 4.0 | 1.00 | 1.89 | 5.0 |
| | 3.6 | 1.39 | 2.37 | 6.0 |
| | 3.2 | 1.86 | 2.80 | 7.0 |

*Fig. 5*

| IMAGE | bpp output from SQ | CR-I | MAER-I | RMSER-I |
|---|---|---|---|---|
| MR | 7 | 2.8 | 1.43 | 1.17 |
|  | 6 | 4.0 | 2.05 | 1.73 |
|  | 5 | 6.3 | 2.94 | 2.25 |
| DR | 11 | 2.5 | 1.47 | 1.21 |
|  | 10 | 3.4 | 1.52 | 1.38 |
|  | 9 | 5.3 | 1.61 | 1.45 |
| CT | 11 | 2.2 | 6.25 | 2.50 |
|  | 10 | 2.2 | 3.41 | 1.88 |
|  | 9 | 2.8 | 1.88 | 1.50 |

Fig. 6

| IMAGE | bpp output from SQ | CR-I | MAER-I | RMSER-I |
|---|---|---|---|---|
| MR | 7 | 2.8 | 1.43 | 1.17 |
|  | 6 | 3.3 | 1.67 | 1.67 |
|  | 5 | 4.2 | 2.13 | 1.69 |
| DR | 11 | 2.5 | 1.47 | 1.21 |
|  | 10 | 2.9 | 1.39 | 1.44 |
|  | 9 | 3.6 | 1.72 | 1.49 |
| CT | 11 | 2.2 | 6.25 | 2.50 |
|  | 10 | 2.1 | 4.34 | 2.42 |
|  | 9 | 2.1 | 2.82 | 1.67 |

Fig. 7

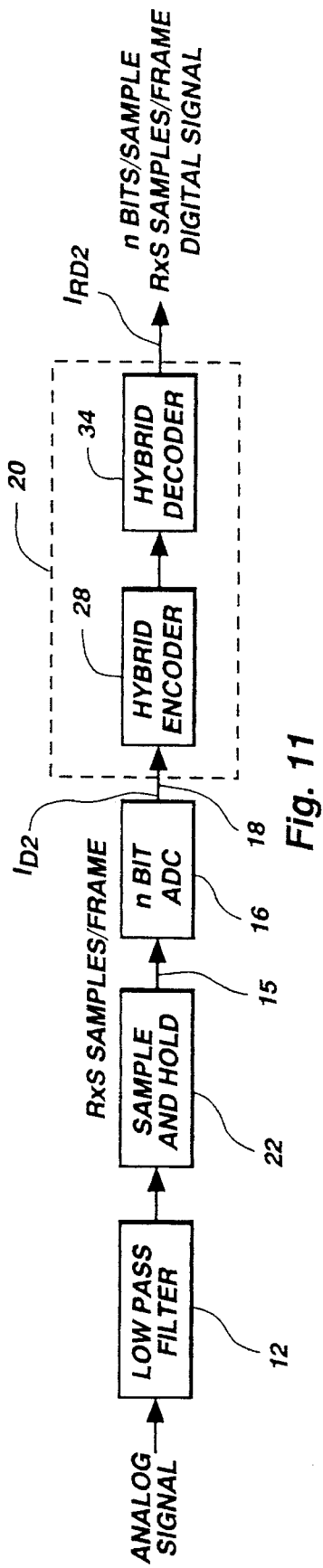
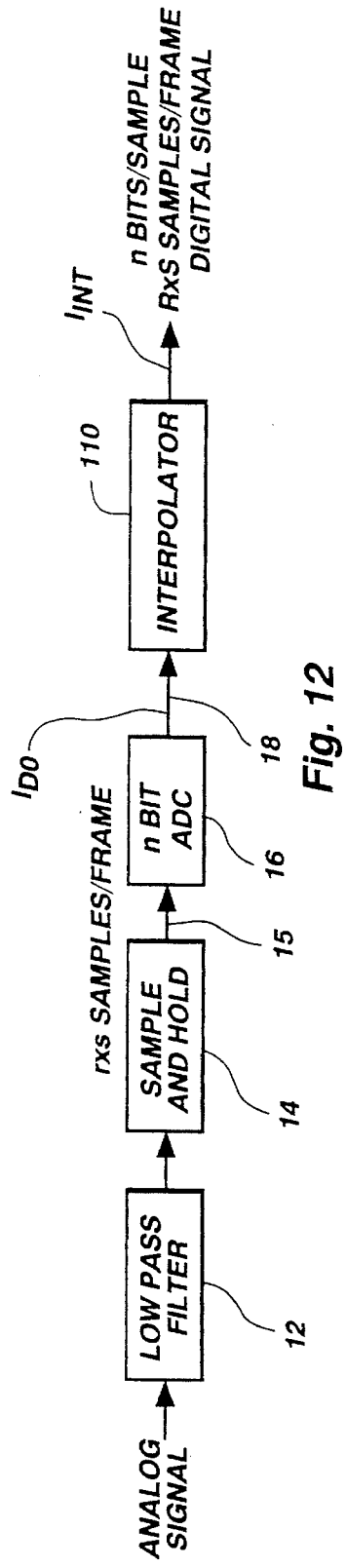
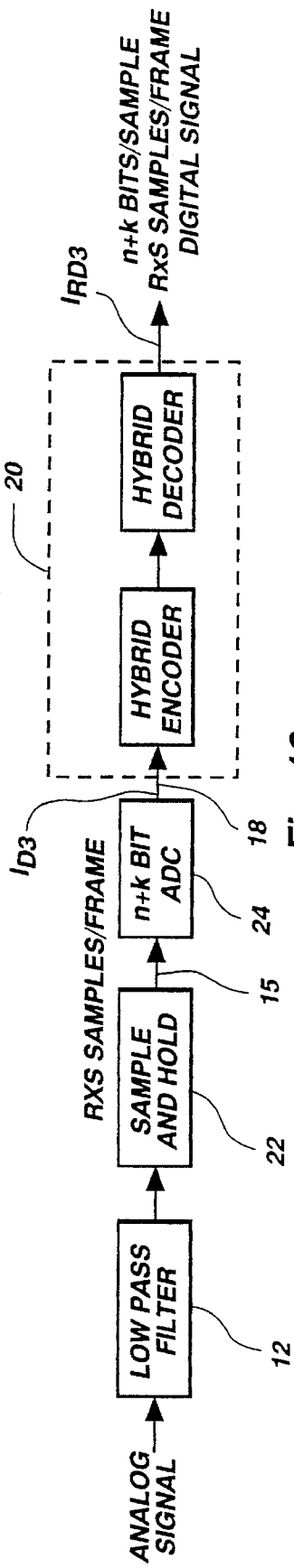

| IMAGE | bpp | $MAE_{SQ}$ | $RMSE_{SQ}$ | MAX ERROR$_{SQ}$ |
|---|---|---|---|---|
| MR | 4 | 1.22 | 3.31 | 70 |
| DR | 6 | 2.11 | 7.90 | 697 |
| CT | 6 | 3.39 | 8.20 | 371 |

Fig. 13

| IMAGE | bpp | $MAE_{VQSC\text{-}II}$ | $RMSE_{VQSC\text{-}II}$ | MAX ERROR$_{VQSC\text{-}II}$ |
|---|---|---|---|---|
| MR | 2.5 | 0.35 | 0.60 | 1.0 |
|  | 1.2 | 0.94 | 1.42 | 4.0 |
|  | 0.9 | 1.16 | 1.80 | 8.0 |
|  | 0.8 | 1.28 | 2.18 | 12.0 |
|  | 0.6 | 1.40 | 2.37 | 16.0 |
| DR | 4.4 | 0.34 | 0.58 | 1.0 |
|  | 2.5 | 1.16 | 1.61 | 4.0 |
|  | 2.1 | 1.36 | 1.95 | 8.0 |
|  | 1.3 | 2.61 | 3.52 | 12.0 |
|  | 1.2 | 2.71 | 3.72 | 16.0 |
| CT | 5.0 | 0.08 | 0.28 | 1.0 |
|  | 4.3 | 0.71 | 1.44 | 4.0 |
|  | 3.0 | 2.09 | 3.12 | 8.0 |
|  | 2.4 | 2.70 | 3.99 | 12.0 |
|  | 2.2 | 2.95 | 4.43 | 16.0 |

Fig. 14

| IMAGE | bpp output from SQ | CR-II | MAER-II | RMSER-II |
|---|---|---|---|---|
| MR | 4 | 4.4 | 1.05 | 1.84 |
| DR | 6 | 2.9 | 1.55 | 4.05 |
| CT | 6 | 2.7 | 1.15 | 1.85 |

Fig. 15

FIXED QUALITY SOURCE CODER WITH FIXED THRESHOLD

RELATED APPLICATIONS

This application is a continuation-in-part of U.S. patent application No. 08/218,601, filed Mar. 28, 1994, now abandoned.

BACKGROUND OF THE INVENTION

1. Field of the Invention

The present invention relates to a source coder and, more particularly, to a fixed quality source coder with a fixed threshold that may be used in compression of medical image data.

2. State of the Art

In a normal hospital radiological environment, a large amount of medical image data is generated from different modalities, such as computed tomography (CT), magnetic resonance (MR) imaging, and computed radiography (CR). Devices that process the image data typically include an analog-to-digital converter (ADC) that converts analog image data to digital image data. Converting to digital image data serves two purposes. First, there are certain advantages in processing digital rather than analog data. Second, the process of digitizing analog data has the potential of more efficiently compressing the analog data because the compressed digital data can take less memory space to store.

A quantizer is a device that represents one signal that can take on a large number of values by another signal that can take on only a limited number of values. A four-bit ADC, for example, represents the value of a continuously varying (i.e., analog) signal by a digital signal that can have only one of sixteen values. Scalar quantizers operate on signals having a single degree of freedom, such as an ADC operating on a voltage signal. ADCs perform "scalar quantization" (SQ) in that each sample is unrelated to the previous and next samples.

Referring to FIG. 1, a traditional source coder 10 includes a low pass filter 12, a sample and hold circuit (S/H) 14, and an n-bit ADC 16. Typically, S/H 14 and ADC 16 work together. Low pass filter 12 removes high frequency components from the analog input signal to prevent aliasing problems. S/H 14 samples the continuous waveform into a discrete analog signal on conductor 15 that is digitized by ADC 16, which typically is a uniform scalar quantizer that converts the analog signal into one of a finite number of uniformly spaced levels spanning the analog range. The sampling rate of S/H 14 controls the number of r x s samples/frame of an image. For example, a typical value for r x s samples/frame is 512×512 samples/frame. ADC 16 provides a digital signal $I_{D0}$ to conductor 18. Because there are a finite number of sampling points for sample and hold circuit 14 and a finite number of levels in ADC 16, the conversion of the original analog signal to a digital signal $I_{D0}$ introduces quantization error when compared to the original analog signal. All ADCs have a finite number of levels and all ADCs have quantization distortion. Because a finite number of levels are used to represent the data accurately, some data compression occurs in all ADCs.

Vector quantizers, by contrast, operate on signals having multiple degrees of freedom. In contrast to SQ, vector quantization (VQ) deals with a block of samples or vector at once, and as a result VQ has some performance advantages as compared with scalar quantization. VQ can be viewed as pattern matching, where input patterns or vectors are approximated by one of many stored patterns in a codebook. The resulting quantization error from such an approximation clearly depends upon how well the stored patterns, referred to as codevectors, represent the input vectors. Consequently, codebook generation may be greatly improved by prior knowledge of the information source and is important to the performance of VQ.

Consider an image that is divided into numerous small areas called pixels (for picture element). Pixels are sufficiently small that the intensity of the image is approximately constant across the pixel area. For example, a black and white image of a house might be divided into a grid of 600 rows and 600 pixels per row. Each pixel would be like a small dot in the image. A block or group of pixels in the same region would form a vector which can be thought of as a small subimage. For example, a 6×6 square block of pixels forms a 36 element vector, which may be a portion of a shadow or part of the roof line against a light background.

Mean-removed VQ (MRVQ) is a special case of product codes. Product codes refer to a family of vector quantization methods in which one large codebook is replaced by more than one smaller codebook. As a result, the vector space represented by the overall quantizer is given as the Cartesian product of smaller vector spaces, and hence the name product codes. In MRVQ, the sample mean of each input vector is computed and then subtracted from every vector component. The resulting mean removed, or residual, vector is then vector quantized. The utility of MRVQ is that the residual vectors can be adequately represented with many fewer codevectors as compared to the original image vectors. The mean of each vector is also coded and included along with each codevector index. Since the mean is a scalar quantity, it is scalar quantized. As a result, the mean includes all of the possible quantization levels of the scalar quantizer. MRVQ can provide a significant reduction in the overall complexity of a VQ system as compared to direct VQ.

It is desirable to apply a high quality compression in order to reduce storage costs. Data compression techniques are typically classified as either lossy or lossless. Lossy algorithms are capable of high compression ratios, but they may distort the data in some way which is not tolerable for some diagnostic medical images. Lossless algorithms do not distort the data, but they are limited to much lower compression ratios. It is noteworthy that an ADC with a finite number of levels with binary codes is a lossy compressor because there is quantization error. In many applications, the ADC outputs are losslessly sent to the decoder, but there still is quantization error of the original ADC at the decoder.

SUMMARY OF THE INVENTION

A fixed quality source coder receives and performs VQ on an input signal $I_D$. The signal $I_D$ may be characterized by the number of bits/sample (intensity) and the number of samples/frame (spatial resolution), and may be provided by a traditional source coder. The traditional source coder may include a sample-and-hold (S/H) circuit producing rxs samples/frame and an ADC providing n bits per pixel. In a first embodiment, the number of bits/sample is increased. In the second embodiment, the number of samples/frame is increased. In a third embodiment, both the number of bits/sample and the number of samples/frame are increased.

Measurements made in simulations involving the first and second embodiments show that the fixed quality source coder has a smaller data rate, mean absolute error (MAE)

and root mean square error (RMSE) than that of the traditional source coder, while maintaining the same or less maximum error. It is believed that the third embodiment would have superior results to that of the first and second embodiments.

The fixed quality source coder includes an encoder and may also include a decoder. The encoder may include a lossy codec that receives and encodes the signal $I_D$ to provide encoded information to a multiplexer regarding the signal $I_D$. The lossy codec also decodes the encoded signal to produce a decoded signal $I_{VQ}^{-1}$. A summer receives $I_D$ and $I_{VQ}^{-1}$ and determines an error signal $E_R$, where $E_R$ may equal $I_D$-$I_{VQ}^{-1}$. A threshold circuit receives the signal $E_R$ and passes a threshold signal $E_T$, which may perform the following equation: $E_T=E_R-T$ when $E_R>T$, $E_T=0$ when $-T \leq E_R \leq T$, and $E_T=E_R+T$ when $E_R<-T$. (Of course, the decisions at the equalities could be different, such as, for example, $E_T=E_R-T$ when $E_R \geq T$, $E_T=0$ when $-T<E_R<T$, and $E_T=E_R+T$ when $E_R \leq -T$.) The threshold level T may be set to ensure that the maximum error allowed in the encoder is equal to a particular desired maximum error. This allows a particular user to set a maximum error. The threshold level T may be changed by the user.

The maximum error may be equal to the least significant bit of an n-bit ADC or to some other greater or lesser value. The signal $E_T$ is then received by a preferably lossless encoder that produces an error component signal $\overline{E}_T$. The decoder receives and decodes the signal $\overline{E}_T$ and the encoded information to produce $I_{RD}$, which is a reconstruction of the original signal $I_D$.

BRIEF DESCRIPTION OF THE DRAWINGS

FIG. 4 is a table showing theoretical mean absolute error (MAE), root mean square error (RMSE), and maximum error values for the traditional source coder when it is encoding uniformly distributed random noise. The results are shown for cases of truncation and rounding the k least significant number of bits, where k=1, 2, . . . , 6.

FIG. 5 is a table showing the measured $MAE_{VQSC-I}$, $RMSE_{VQSC-I}$, and Max $Error_{VQSC-I}$ results of the fixed quality source coder of the present invention for tested MR, CT, and DR images and particular bits per pixel (bpp).

FIG. 6 is a table showing SQ to VQSC-I compression ratio (CR-I), SQ to VQSC-I mean absolute error ratio (MAER-I) and SQ to VQSC root mean square error ratio (RMSER-I), where SQ is performed by truncation.

FIG. 7 is a table showing SQ to VQSC-I compression ratio (CR-I), SQ to VQSC-I mean absolute error ratio (MAER-I) and SQ to VQSC-I root mean square error ratio (RMSER-I), where SQ is performed by rounding.

FIG. 11 is a block diagram of a fixed quality source coder in combination with a traditional source coder according to a second embodiment of the present invention.

FIG. 12 is a block diagram of a circuit used to make comparisons between the fixed quality source coder of the second embodiment of the present invention and a traditional source coder.

FIG. 13 is a table showing the measured $MAE_{SQ-II}$, $RMSE_{SQ-II}$, and Max $Error_{SQ-II}$ results of the traditional source coder for MR, DR, and CT images, for particular bits per pixels.

FIG. 14 is a table showing the measured $MAE_{VQSC-II}$, $RMSE_{VQSC-II}$, and Max $Error_{VQSC-II}$ results of the fixed quality source coder for MR, DR, and CT images, for particular bits per pixels.

FIG. 15 is a table showing SQ to VQSC-II compression ratio (CR-I), SQ to VQSC-II mean absolute error ratio (MAER-I) and SQ to VQSC-II root mean square error ratio (RMSER-II).

FIG. 19 is a block diagram of a fixed quality source coder in combination with a traditional source coder according to a third embodiment of the present invention.

DETAIL DESCRIPTION OF PREFERRED EMBODIMENTS

A. Structure and Operation

Figure 2:
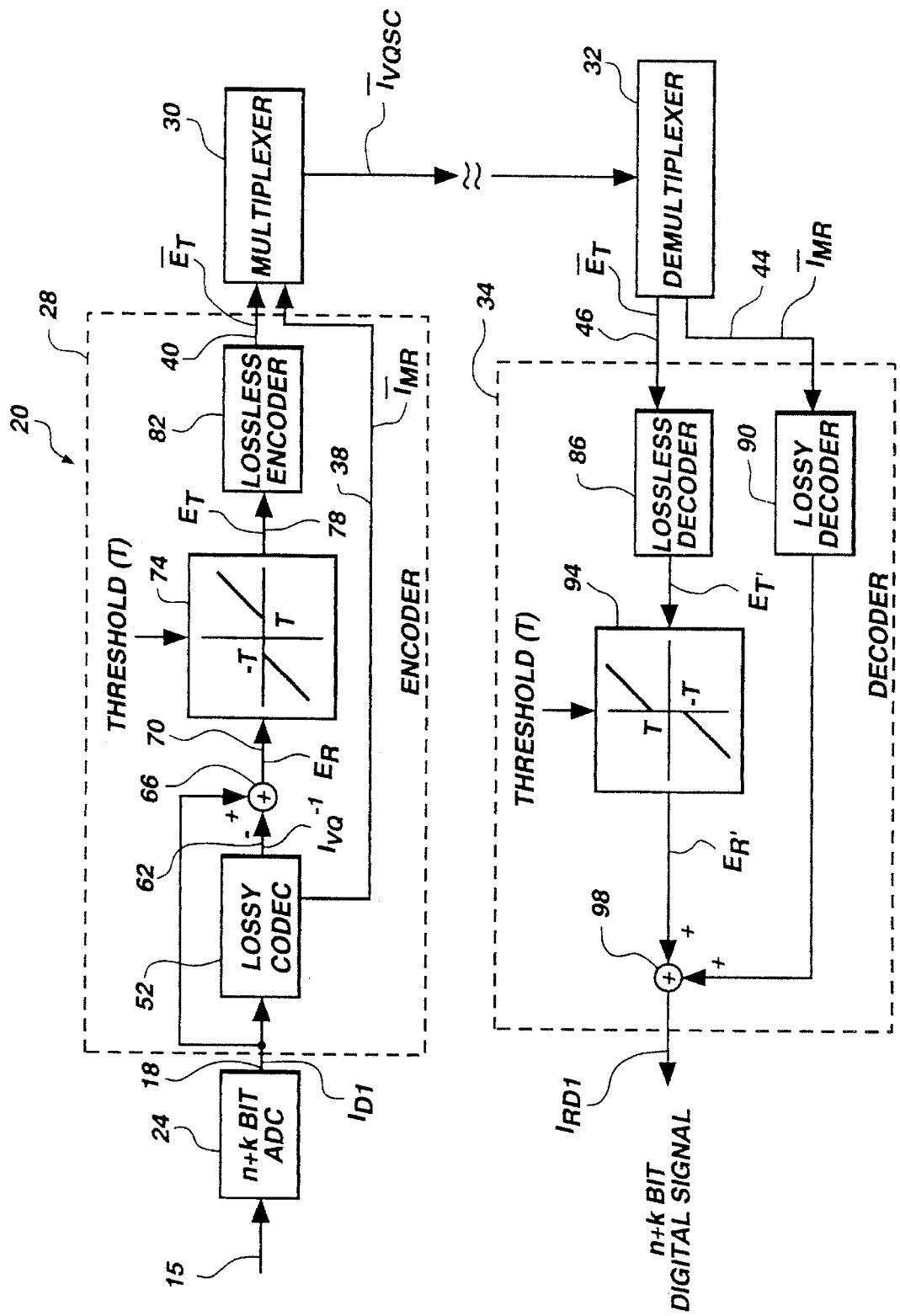
FIG. 2 is a block diagram of a fixed quality source coder in combination with a traditional source coder according to a first embodiment of the present invention.
Figure 8:
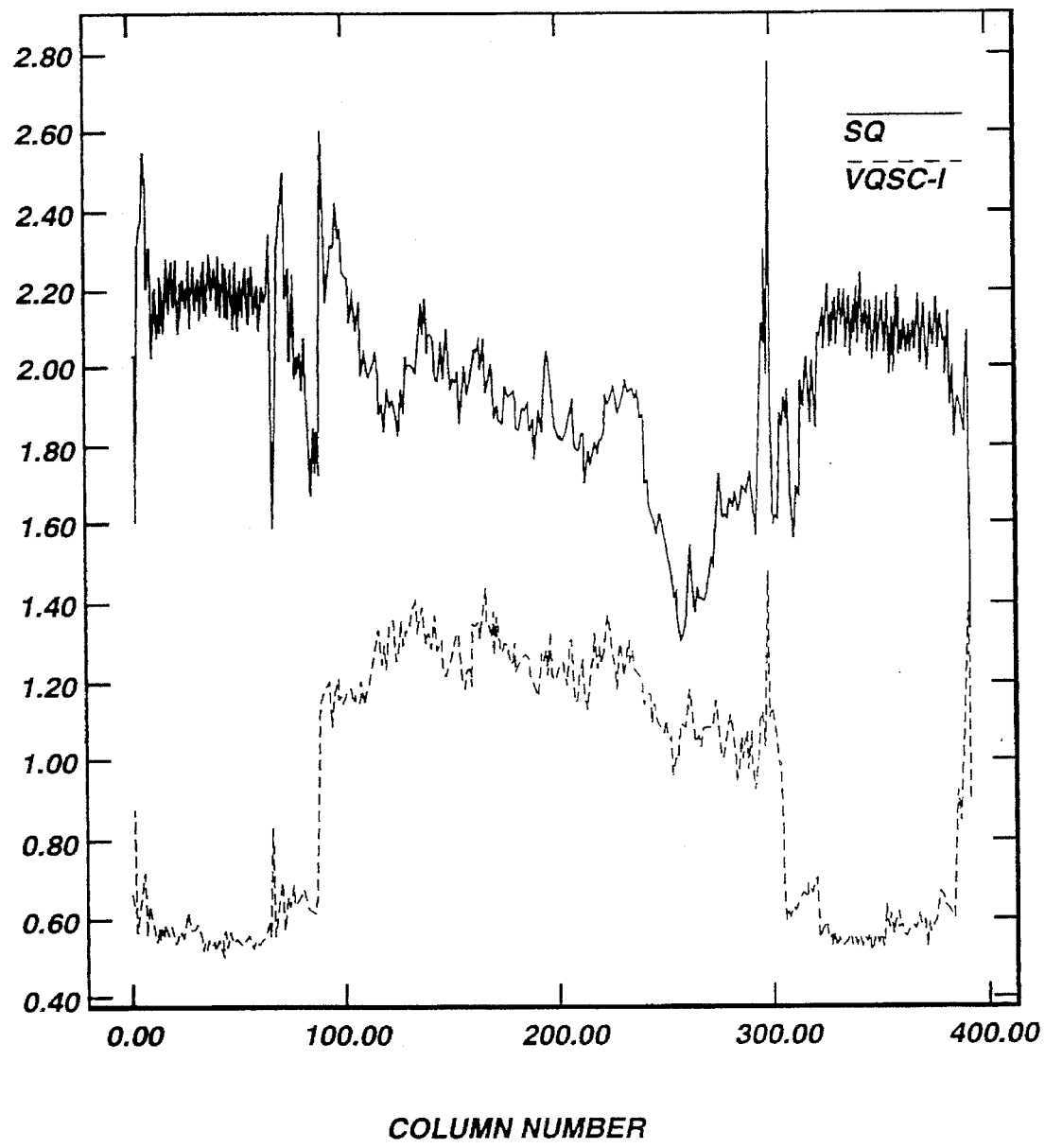
FIG. 8 is a graph showing average error versus column number for MR images of VQSC-I and SQ.

Referring to FIG. 2, the present invention includes a combination of a fixed quality source coder (hybrid coder) 20 with traditional source coder 10 in which the number of bits/pixel (intensity) and/or samples per frame (spatial resolution) is increased. In the particular embodiments described in connection with FIG. 2, the bits/pixel is increased, but the samples/frame remains the same as that of a traditional source coder.

First and second embodiments of the invention illustrate the performance of fixed quality source coder 20. In the first embodiment, illustrated in FIG. 2, the intensity (or pixel depth) of the signal $I_{D1}$ received by fixed quality source coder 20 is increased by increasing the number of bits of ADC 16 in traditional source coder 10. In the second embodiment, illustrated in FIG. 11, the spatial resolution of the signal $I_{D2}$ received by fixed quality source coder 20 is increased by increasing the sampling rate of S/H 22 (and, if necessary, the cut-off frequency of low pass filter 12). As compared to traditional source coder 10 alone without the increased intensity or spatial resolution, the first and second embodiments have a substantially better compression ratio, better average error and data rate, and at least as good maximum error.

In a third embodiment, illustrated in FIG. 19, which is a combination of the first and second embodiments, both the intensity and spatial resolution are increased. It is believed that the third embodiment will have superior results to that of the first and second embodiments.

As used herein, S/H 14 operates at rxs samples/frame (e.g. 512×512), and S/H 22 is a sample-and-hold circuit operating at RxS samples/frame (e.g. 1024×1024). Note that the cut-off frequency of low pass filter 12 may be adjusted depending on the frequency of S/H 14 or S/H 22. ADC 16 is an n-bit ADC and ADC 24 is an n+k bit ADC, where k is a positive integer. For comparison purposes only, R/r=1,2, . . . , and S/s=1,2, . . . . However, no particular value of R, r, S, or s are required.

Figure 1:
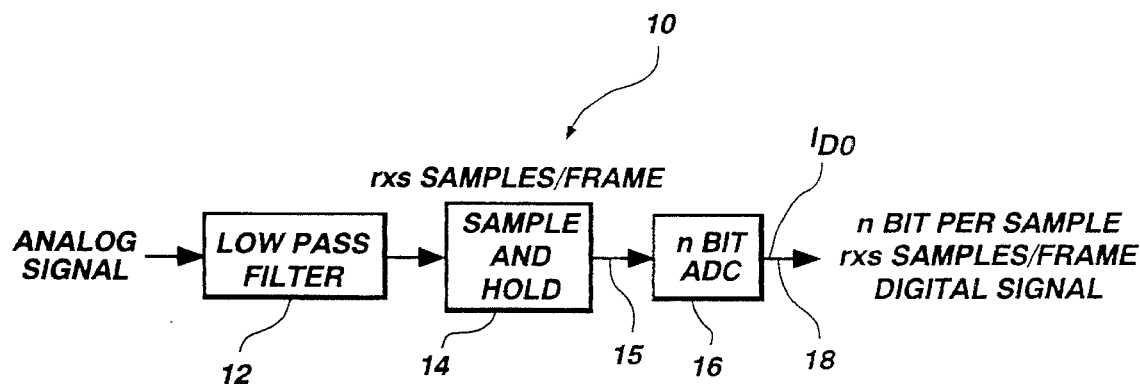
FIG. 1 is a schematic of a prior art source coder.

The combination of S/H 14 and ADC 16 produces signal $I_{D0}$ on conductor 18, as shown in FIG. 1. The combination of S/H 14 and ADC 24 produces signal $I_{D1}$ on conductor 18, as shown in FIG. 2. The combination of S/H 22 and ADC 16 produces signal $I_{D2}$ on conductor 18, as shown in FIG. 11. The combination of S/H 22 and ADC 24 produces signal $I_{D3}$ on conductor 18, as shown in FIG. 19 Signal "$I_D$" is used to represent a generalized signal that could be $I_{D1}$, $I_{D2}$, or $I_{D3}$ depending on which embodiment is employed.

The value of fixed quality source coder 20 becomes apparent when it is considered that the extra expense and space associated with increasing the number of bits of ADC 16 or increasing the sampling rate of S/H 14 is minuscule in comparison with the savings reaped by reduced memory requirements. At the same time, doctors and hospitals can be assured that a particular maximum error level is met.

Referring to FIG. 2, a preferred embodiment fixed quality source coder 20 includes an encoder 28, a multiplexer 30, a demultiplexer 32, and a decoder 34. Fixed quality source coder 20 receives signal $I_{D1}$ on conductor 18 from S/H 14 and ADC 24. Typically, there is a storage device and/or a transmission link between multiplexer 30 and demultiplexer 32. In the case where the data is stored for later use, the amount of memory in the storage device is typically enormous.

Encoder 28 produces an encoded information signal $\bar{I}_{MR}$ on conductor 38 regarding signal $I_{D1}$ and an error component signal $\bar{E}_T$ on conductor 40, which are provided to multiplexer 30. An overscore signifies that a parameter is vector quantized. In a preferred embodiment of fixed quality source coder 20, the encoded information $\bar{I}_{MR}$ includes a mean residual vector quantizer (MRVQ) component and address information. Multiplexer 30 provides a signal $\bar{I}_{VQSC}$.

As used herein, VQSC signifies "vector quantization source coder" and represents fixed quality source coder 20. VQSC-I signifies "vector quantization source coder" with respect to the first embodiment of the invention. VQSC is contrasted with SQ, which signifies scalar quantization and represents traditional source coder ADC 10, as shown in FIG. 1.

The information in multiplexer 30 may be stored and later reconstructed as follows. Demultiplexer 32 provides MRVQ component and address information $\bar{I}_{MR}$ and error component $\bar{E}_T$ on conductors 44 and 46, respectively, which are received by decoder 34. Decoder 34 includes a lossless decoder 86, a lossy decoder 90, a threshold circuit 94, and a summer 98, together which perform the inverse of encoder 28 to provide a reconstructed digital signal $I_{RD1}$, having rxs samples/frame and n+k bits per sample. Ideally, $I_{RD1}$ is identical to $I_{D1}$, but in practice $I_{RD1}$ will be only a very close approximation of $I_{D1}$.

Encoder 28 includes a lossy codec 52 that receives signal $I_{D1}$. Lossy codec 52 includes an encoder that performs VQ on signal $I_{D1}$ to produce encoded information signal $\bar{I}_{MR}$ on conductor 38, and a decoder that produces a signal $\bar{I}_{VQ}^{-1}$, which is a reconstruction of signal $I_{D1}$. Lossy codec 52 may perform any of a variety of VQ techniques or other lossy techniques. These techniques include, but are not limited to, tree-structured VQ (TSVQ), multi-stage VQ (MSVQ), hierarchical VQ (HVQ), and JPEG. Adaptive algorithms may be employed in adaptive tree search vector quantization (ATSVQ), multi-stage adaptive search VQ (MASVQ), and hierarchical adaptive search vector quantization (HASVQ).

TSVQ has low encoding complexity and performance that is close to the optimal full search encoder for VQ. MSVQ is a product code technique and has the same low complexity as TSVQ. However, the memory requirement for a MSVQ codebook is directly proportional to the number of stages while the memory requirement for a TSVQ codebook is exponentially proportional to the codebook address size. In MSVQ, the performance improvement rapidly degrades as the number of stages increases.

In MRVQ, the mean of each vector is subtracted from each vector component before the codebook generation process begins. For reasonably sized codebooks, however, there are occasions when the codebook can no longer adequately represent edge or texture information. HVQ has been proposed to overcome this problem. In HVQ, an image is usually partitioned into several blocks of different size such that the contents of the smaller blocks are inside the larger blocks. An independent codebook using a standard VQ codebook generation algorithm (such as LBG) is generated for each block size. In the encoding process, the largest block is encoded first. If the texture or information in the image is not adequately recovered, the next smaller block is encoded, and so forth. HVQ has the greatest encoding complexity and memory requirement of the techniques described herein.

The JPEG technique is described in Wallace et al., "The JPEG Still Picture Compression Standard," IEEE Transactions on Consumer Electronics, Vol. 38, No. 1, February 1992, pp. xviii–xxxiv.

TASVQ and HASVQ are adaptive versions of TSVQ and HVQ, respectively, and provide much better performance. A version of ATSVQ is described in U.S. Pat. No. 5,172,228 to Paul D. Israelsen, entitled "Image Compression Method and Apparatus Employing Distortion Adaptive Tree Search Vector Quantization." The MASVQ technique has the low complexity and simple structure of the MSVQ, but better performance.

The following adaptive algorithm is presented for ATSVQ but may be used in various other techniques. In the adaptive tree search for ATSVQ, given a constant rate, the encoder traverses the depth of the tree where it will search for a match that best describes the input vector. Depending on the given rate, the encoder will search down the tree to find the best possible match or will stop somewhere along the tree and transmit a shorter codeword suffering a minimal increase in distortion. For the product VQ (e.g., mean-residual with adaptive search), however, if the input vector is rather flat, then only the mean of the vector needs to be transmitted and a few bits are saved for more active vectors which take more bits to be transmitted. A buffer is used to allow the encoder to adapt to varying statistics of the input vectors. The buffer characteristics are defined using two parameters, the error threshold and the current buffer level. The error threshold is usually a function of the current buffer level, and the choice of this function can be optimized to improve algorithmic performance. The function is chosen to be linear. The following is a pseudocode form of the algorithm:

1: Based on the initial buffer level evaluate the initial threshold.

2: Given an input vector, do a) while distortion > threshold look for the best match (minimum distortion) for the input vector at the current level of the tree codebook. If distortion ≦ threshold then go to step b. else if the current level ≦ maximum level of the tree codebook, then current level=current level+1 else go to step b.
b) Determine the number of bits n for the best match. This includes the index along with a prefix to identify the level of the tree where the best match was found.
c) Use n found in the previous step to update the current buffer level b according to b=b+n−outbits where outbits is the designated constant rate of the encoder.
d) Evaluate the new threshold.

This adaptive algorithm is a rather universal scheme and can easily be adapted to different VQ techniques, as described below.

For MRVQ, the algorithm can be modified so that when the distortion., compared to the mean only, is less than the threshold only, the index of the mean of the vector would be transmitted. This saves encoding time and channel bandwidth.

When the HASVQ employs the adaptive search algorithm, the HASVQ algorithm starts with the largest block (vector). If the distortion is still greater than the threshold after going down to the bottom of the tree-structured codebook (for the respective vector), then the entire adaptive encoding process restarts for the next block size, and so on. The index of the best match along with a prefix that includes the codebook type (vector size) plus the level of the tree are transmitted.

MASVQ may also employ the adaptive search algorithm. MASVQ is particularly suited to exploit the successive approximation nature of a multi-stage VQ codebook. Given a constant rate, the encoder searches every successive stage and looks for the best match. If the rate is high, the encoder will search through all the stages, and if the rate is low, the encoder will compromise with a minimum increase in distortion for a shorter codeword. MASVQ employs a buffer adapted to the varying statistics of the input image. As the input vector arrives, the multi-stage codebook is searched for the best match starting with the first stage and traversing through the successive codebooks one stage at a time. If the distortion requirement is met, further search of the codebook is terminated and the index of the best match along with a prefix to specify the stage of the search are transmitted. The tree-structured codebook may be incorporated at each stage of the search. Therefore, in a sense, MASVQ is an adaptive algorithm not only along each successive stage, but also adaptive for each level of the tree-structured codebook of the respective stage. Consequently, the prefix specifies the stage and the level of the codebook for that stage.

MASVQ may employ a tree structured codebook. MASVQ with a tree structured codebook was employed in lossy codec 52 to make the performance measurements described below.

MRVQ is described in U.S. Pat. No. 4,958,225 to Bi et al, entitled "A Full-Search-Equivalent Method For Matching Data and A Vector Quantizer Utilizing Such Method," and in a PhD. dissertation entitled "Vector Quantization of Digital Images" by Richard Baker, published in June 1984 at Stanford University. A preferred circuit for searching the codebook in MRVQ is described in U.S. Pat. No. 5,031,037 to Paul D. Israelsen entitled "Vector Quantizer Codebook Processing Circuit."

Multiplexer 30 and demultiplexer 32 are desirable, but may not be necessary depending on the type of encoding that is used in lossy codec 52.

Referring to FIG. 2, a summer 66 receives signals $I_{D1}$ and $I_{VQ}^{-1}$ and provides residual data signal $E_R$ to conductor 70, where $E_R = I_{D1} - I_{VQ}^{-1}$. Threshold circuit 74 receives $E_R$ and a programmable fixed threshold value T and provides a truncated error signal $E_T$ on conductor 78. The value of truncated error signal $E_T$ is calculated according to equation (1), below:

$$E_T = \begin{cases} E_R - T, & \text{if } E_R > T; \\ 0, & \text{if } -T \leq E_R \leq T; \\ E_R + T, & \text{if } E_R < -T. \end{cases} \quad (1)$$

where $E_R$ and T are described above. The maximum error allowed then is the threshold T.

The threshold T is set to insure the maximum error allowed by fixed quality source coder 20. The value of T is preferably programmable through software or hardwired buttons, allowing the clinician to select the maximum error that may be tolerated. In general, of course, a smaller maximum error leads to larger memory requirements, but usually a reduced maximum error and average error. Threshold T could be equal to the least significant bit of a traditional source coder in FIG. 1, i.e., n-bit ADC 16. Threshold T could be another value according to the desired level of accuracy. If T is other than an integer, rounding or truncation may occur. The threshold T is added back in decoder 34, as described below.

Signal $E_T$ is received by a lossless encoder 82, which provides signal $\overline{E}_T$ to conductor 40. Lossless encoder 82 may be a Rice coder, such as is described in Venbrux et al., "A VLSI Chip Set for High-Speed Lossless Data Compression," *IEEE Transactions on Circuits and Systems for Video Technology*, Vol. 2, No. 4, December 1992, pp. 381–391. Other lossless encoders could be used including, but not limited to Huffman, Splaytrees, and LZW encoders. A lossy encoder could be used in place of lossless encoder 82, but it would introduce additional error.

Referring to decoder 34, lossless decoder 86 provides a signal $E_T'$, which is analogous to signal $E_T$ on conductor 78. Threshold circuit 94 provides $E_R'$ according to equation (2), below:

$$E_R' = \begin{cases} 0, & \text{if } E_T' = 0 \\ E_T' + T, & \text{if } E_T' \geq 0 \\ E_T' - T, & \text{if } E_T' \leq 0, \end{cases} \quad (2)$$

where $E_T'$ is received by threshold circuit 94 and T is the threshold level of threshold circuit 94.

FIG. 2 represents the invention in block diagram form. The functions of encoder 28, multiplexer 30, demultiplexer 32, and decoder 34 could be performed by a microprocessor, related circuitry, and memory. In that case, the "conductors" of FIG. 2 may represent transfer of data to and from memory rather than to the other circuits shown in the FIG. 2.

The analog signal received by low pass filter 12 typically originates from a high quality sensor from contemporaneously detected information. However, the originally sensed signal may be processed by a variety of circuitry including, but not limited to, a low pass filter and a sample-and-hold circuit. Moreover, other circuitry may interact with various circuits of fixed quality source coder 20. For example, processing circuitry could be placed between ADC 24 and encoder 28. Encoder 28 could receive signals from ADC 24 and other circuitry. Multiplexer 30 could receive signals from encoder 28 and other circuitry. In short, fixed quality source coder 20 may interact with or act in combination with other circuitry to provide additional benefits beyond the scope of the present invention.

Referring to FIG. 11, the second embodiment of the invention is illustrated by the combination of fixed quality source coder 20 and a traditional source coder including low pass filter 12, S/H 22 (supplying RxS samples/frame) and n-bit ADC 16, which provides signal $I_{D2}$, having RxS samples/frame and n bits per sample. The bandwidth and cut-off frequency of low pass filter 12 is preferably increased with the increase in samples/frame. The operation of fixed quality source coder 20 is described in connection with FIG. 2, above. Fixed quality source coder 20 provides reconstructed signal $I_{RD2}$, which is ideally equal to $I_{D2}$.

Referring to FIG. 19, the third embodiment of the invention is illustrated by the combination of fixed quality source coder 20 and a traditional source coder including low pass filter 12, S/H 22 (supplying RxS samples/frame) and n+k bit ADC 24, which provides signal $I_{D3}$, having RxS samples/frame and n+ k bits per sample. The operation of fixed quality source coder 20 is described in connection with FIG. 2, above. Fixed quality source coder 20 provides reconstructed signal $I_{RD3}$, which is ideally equal to $I_{D3}$.

Figure 20:
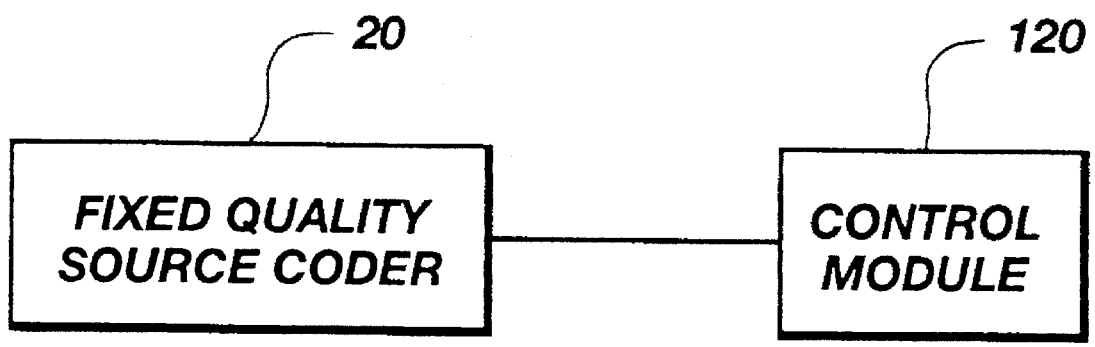
FIG. 20 is a block diagram of controls allowing the user to set the value of threshold T.

Referring to FIG. 20, the value of threshold T in fixed quality source coder 20 may be set by the user through control module 120. Control module 120 could include keys, buttons, or other controls integral to fixed quality source coder 20 or keys, buttons, or other controls in a stand alone computer, such as, for example, an IBM PC type computer or an Apple Macintosh type computer. In a preferred embodiment of the invention, there is only a single value of threshold T for both encoder 28 and decoder 34. Alternatively, the value of threshold T for encoder 28 could be different than the value of threshold T for decoder 34. Again, the user could decide the value of each for their particular needs.

B. Performance

The performance of fixed quality source coder 20 may be illustrated through various measures described below and through comparisons with the performance of the traditional source coder.

The mean absolute error (MAE) and root mean square error (RMSE) are two measures of distortion. The MAE of n-bit ADC 16 (in connection with multiplier circuit 104 in FIG. 3) is $MAE_{SQ}$ and is defined in equation (3), below:

$$MAE_{SQ} = \frac{1}{N} \sum_{i=1}^{N} |I_{Di} - I_{SQi}|, \qquad (3)$$

where N is the total number of pixels, $I_{Di}$ is a particular sample of input signal $I_D$, and $I_{SQi}$ is a particular sample of signal $I_{SQ}$. The MAE of fixed quality source coder 20 is $MAE_{VQSC}$, defined in equation (4), below:

$$MAE_{VQSC} = \frac{1}{N} \sum_{i=1}^{N} |I_{Di} - I_{RDi}|, \qquad (4)$$

where N and $I_{Di}$ are defined above and $I_{RDi}$ is a particular sample of signal $I_{RD}$ at the output of decoder 34.

The RMSE of n-bit ADC 16 (in connection with multiplier circuit 104 in FIG. 3) is $RMSE_{SQ}$, defined in equation (5), below:

$$RMSE_{SQ} = \left[ \frac{1}{N} \sum_{i=1}^{N} (I_{Di} - I_{SQi})^2 \right]^{1/2}, \qquad (5)$$

where N, $I_{Di}$, and $I_{SQi}$ are defined above.

The RMSE of fixed quality source coder 20 is $RMSE_{VQSC}$, defined in equation (6), below:

$$RMSE_{VQSC} = \left[ \frac{1}{N} \sum_{i=1}^{N} (I_{Di} - I_{RDi})^2 \right]^{1/2}, \qquad (6)$$

where N, $I_{Di}$, and $I_{RDi}$ are defined above.

The compression ratio (CR) of n-bit ADC 16 (in connection with multiplier circuit 104 in FIG. 3) to fixed quality source coder 20 is defined in equation (7), below:

$$CR = BR_{SQ}/BR_{VQSC} \qquad (7),$$

where $BR_{SQ}$ is the bit rate of $I_{SQ-k}$ at the output of n-bit ADC 16 (in connection with multiplier circuit 104 in FIG. 3) and $BR_{VQSC}$ is the bit rate of $I_{VQSCi}$ at the output of multiplexer 30. The bit rate (or data rate) is defined as bits per pixel (BPP).

The mean average error ratio (MAER) of scalar quantizer 10 to fixed quality source coder 20 is defined in equation (8), below:

$$MAER = MAE_{SQ}/MAE_{VQSC} \qquad (8),$$

where $MAE_{SQ}$ and $MAE_{VQSC}$ are defined in equations (3) and (4), above.

The root mean square error ratio (RMSER) of scalar quantizer 10 to fixed quality source coder 20 is defined in equation (9), below:

$$RMSER = RMSE_{SQ}/RMSE_{VQSC} \qquad (9),$$

where $RMSE_{SQ}$ and $RMSE_{VQSC}$ are defined in equations (5) and (6), above.

Figure 3:
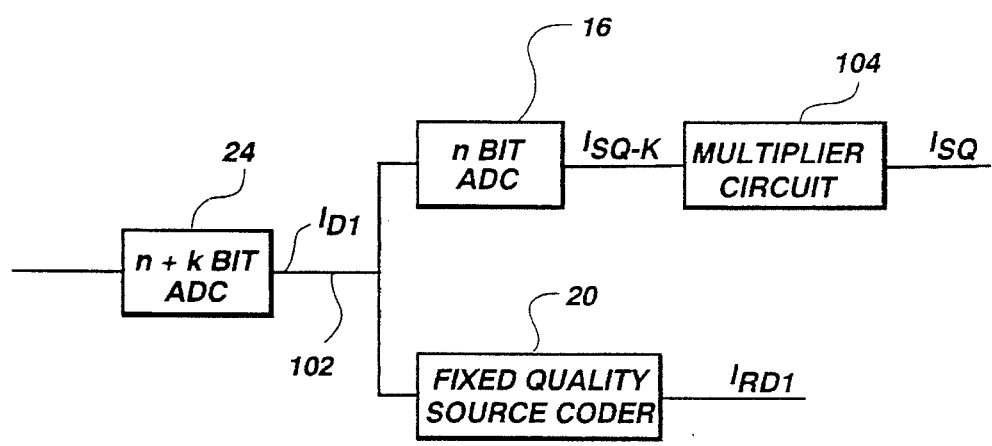
FIG. 3 is a block diagram of a circuit used to make comparisons between the fixed quality source coder of the first embodiment of the present invention and a traditional source coder.

A comparison of the first embodiment of the invention is described in connection with FIG. 3. Referring to FIG. 3, n+k bit ADC 24 receives signal $I_A$ and provides an n+k bit digital signal $I_{D1}$ at conductor 102. Signal $I_{D1}$ is received by n-bit ADC 16 and fixed quality source coder 20. N-bit ADC 16 provides an n-bit scalar quantized signal $I_{SQ-k}$, the least significant bit of which is more significant than the kth bit of the signal $I_{D1}$. For example, if n is 8 and k is 3, $I_{D1}$ would have three bits with less significance than the least significant bit of signal $I_{SQ-k}$. The signal $I_{SQ-k}$ is received by multiplier circuit 104, which multiples the signal $I_{SQ-k}$ by $2^k$ (or shifts left by k-bits) to produce an n+k bit scalar quantized signal $I_{SQ}$. The signal $I_{SQ}$ has n+k bits, the k least significant bits of which are zero. Because ADC 16 performs scalar quantization, the letters "SQ" are used to represent ADC 16 and multiplier 104. Referring to FIGS. 2 and 3, the output of fixed quality source coder 20 is $I_{RD1}$.

Simulations were made with the circuit of FIG. 3 to compare fixed quality source coder 20 with traditional source coder 10. Three different types of medical images were used in the simulations: two magnetic resonance images (MR), one computed tomography (CT) image, and one digital radiography (DR) image. The MR images had 8-bit 480×392 samples per image, the DR image had 12-bit 608×496 samples per image, and the CT image had 12-bit 512×512 samples per image.

The table of FIG. 4 shows theoretical $MAE_{SQ}$, $RMSE_{SQ}$, and maximum error (Max $Err_{SQ}$) for traditional source coder ADC 10 for the cases of truncation and rounding of the specified least significant number of bits (k). The data in the table of FIG. 4 are in counts, i.e., the bit levels. The data present the best possible error measures achievable from a uniform SQ and it is assumed that the image data is uniformly distributed over the range of the quantizer.

The table of FIG. 5 shows the measured $MAE_{VQSC-I}$, $RMSE_{VQSC-I}$, and maximum error (Max $Err_{VQSC-I}$) results of fixed quality source coder 20 for the tested MR, CT, and DR images and particular bits per pixel (bpp).

Using the results of the tables of FIGS. 4 and 5, the tables of FIGS. 6 and 7 show CR-I, MAER-I, and RMSER-I as defined in equations (7), (8), and (9), for particular specified bpp, and in which VQSC-I and SQ have the same maximum error. In FIG. 6, SQ is performed by truncation. In FIG. 7, SQ is performed by rounding. These results are obtained under the same maximum error condition. The tables of FIG. 6 and 7 show that CR-I, MAER-I, and RMSER-I are always greater than 1. That is, in the same maximum error condition, VQSC-I always has a smaller BR, MAE-I, and RMSE-I than SQ. Thus, in every case simulated, VQSC-I is a superior quantizer to the uniform SQ.

Figure 9:
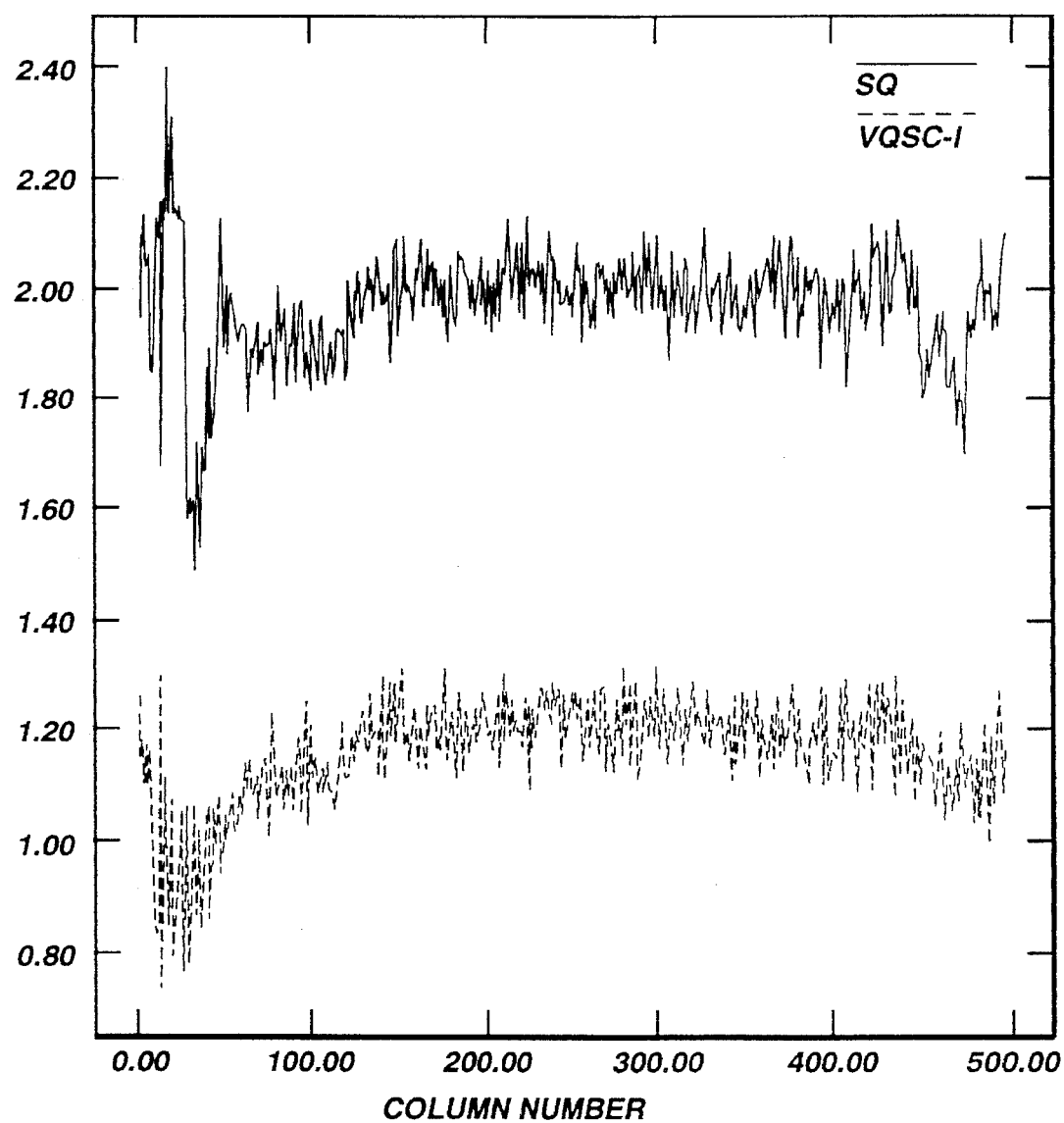
FIG. 9 is a graph showing average error versus column number for DR images of VQSC-I and SQ.
Figure 10:
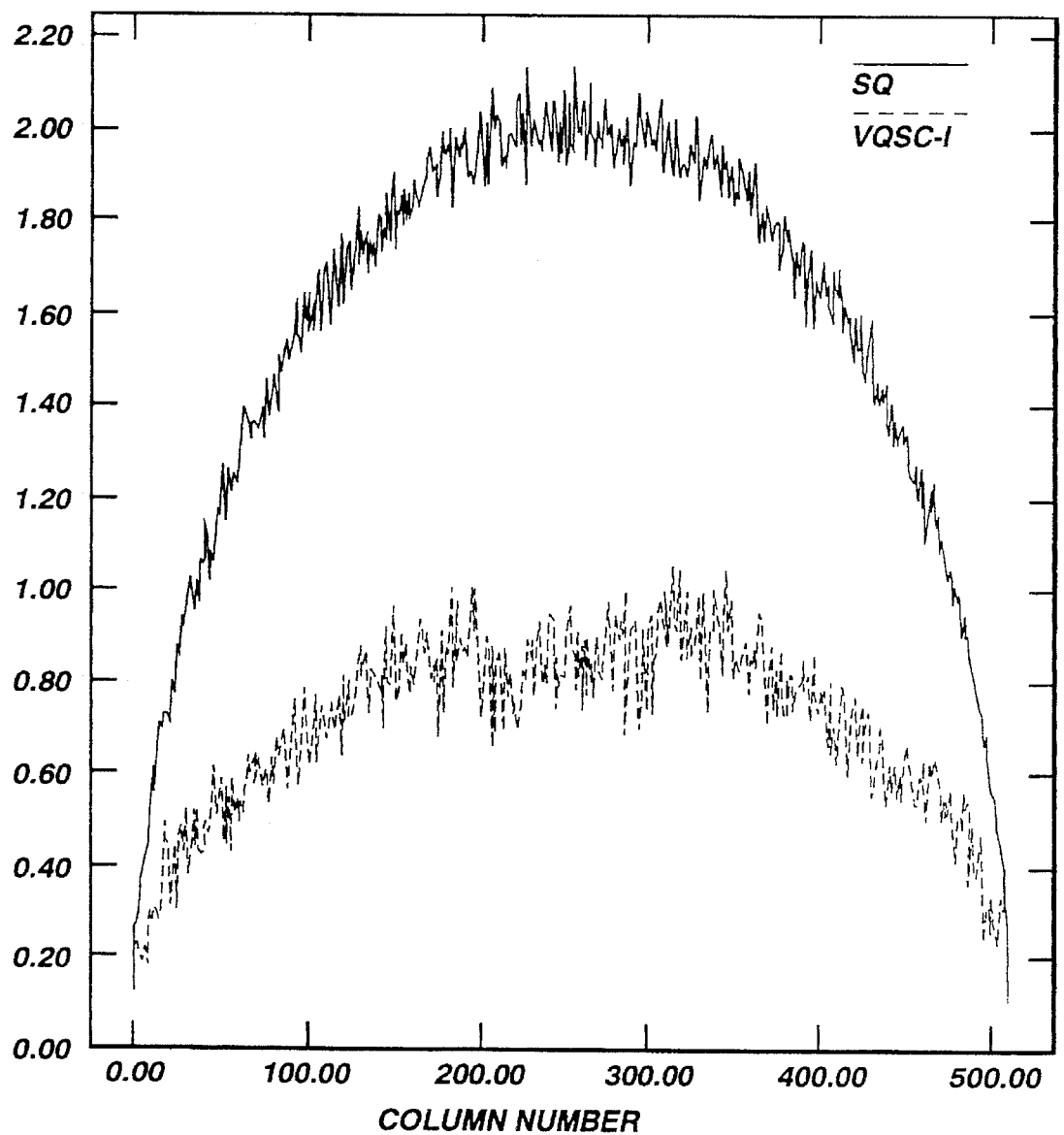
FIG. 10 is a graph showing average error versus column number for CT images of VQSC-I and SQ.
Figure 16:
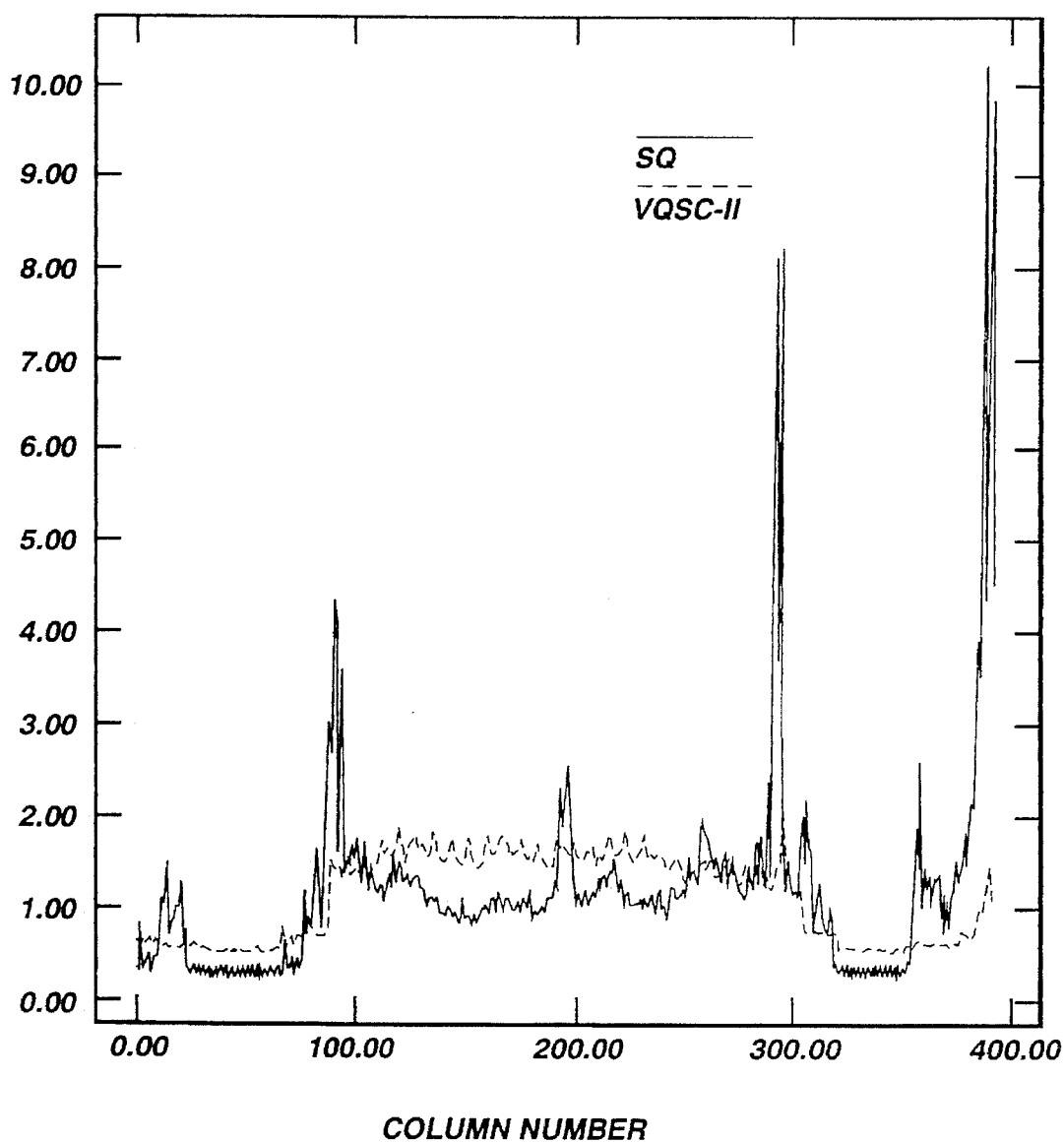
FIG. 16 is a graph showing average error versus column number for MR images of VQSC and SQ.
Figure 17:
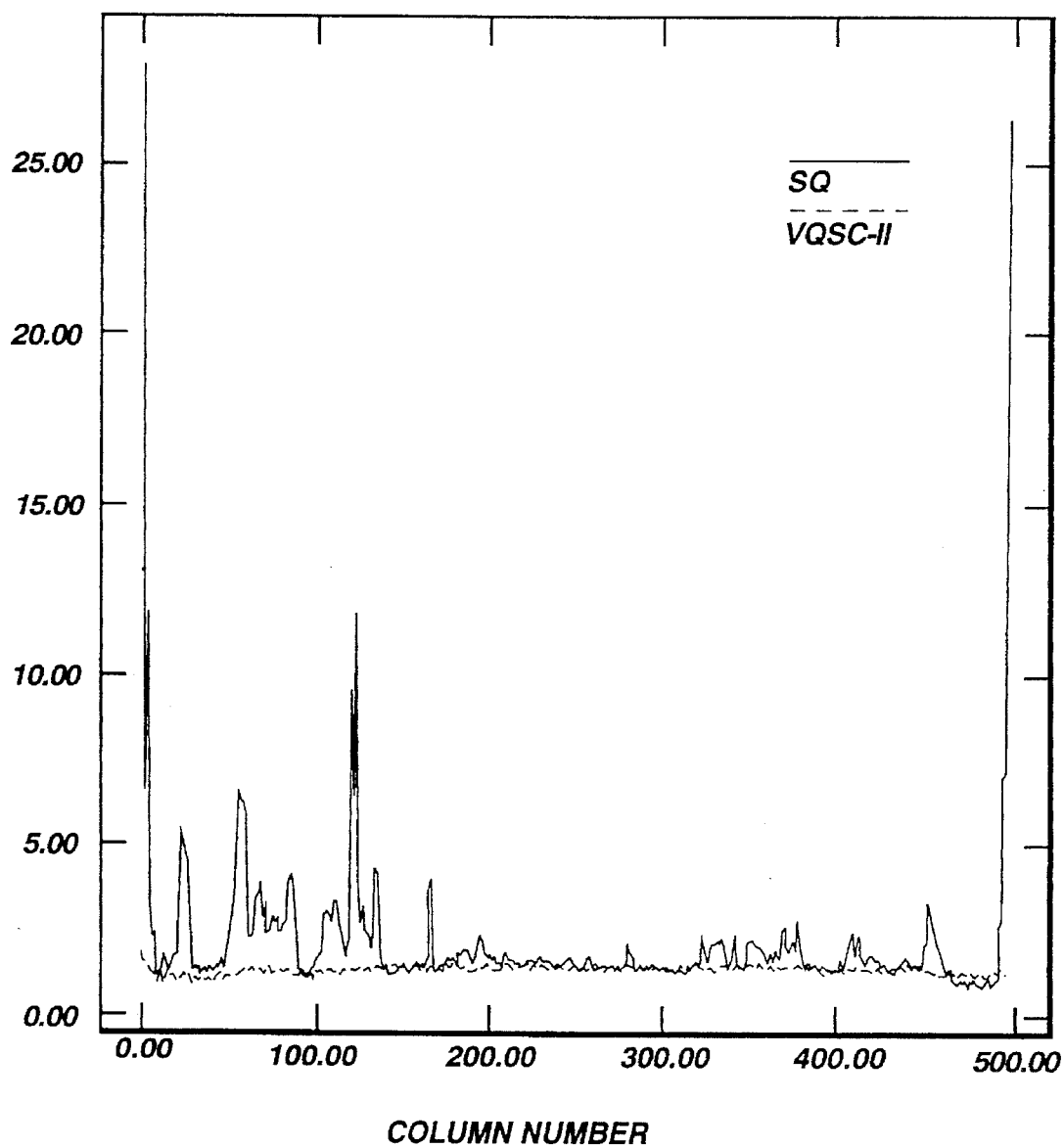
FIG. 17 is a graph showing average error versus column number for DR images of VQSC and SQ.
Figure 18:
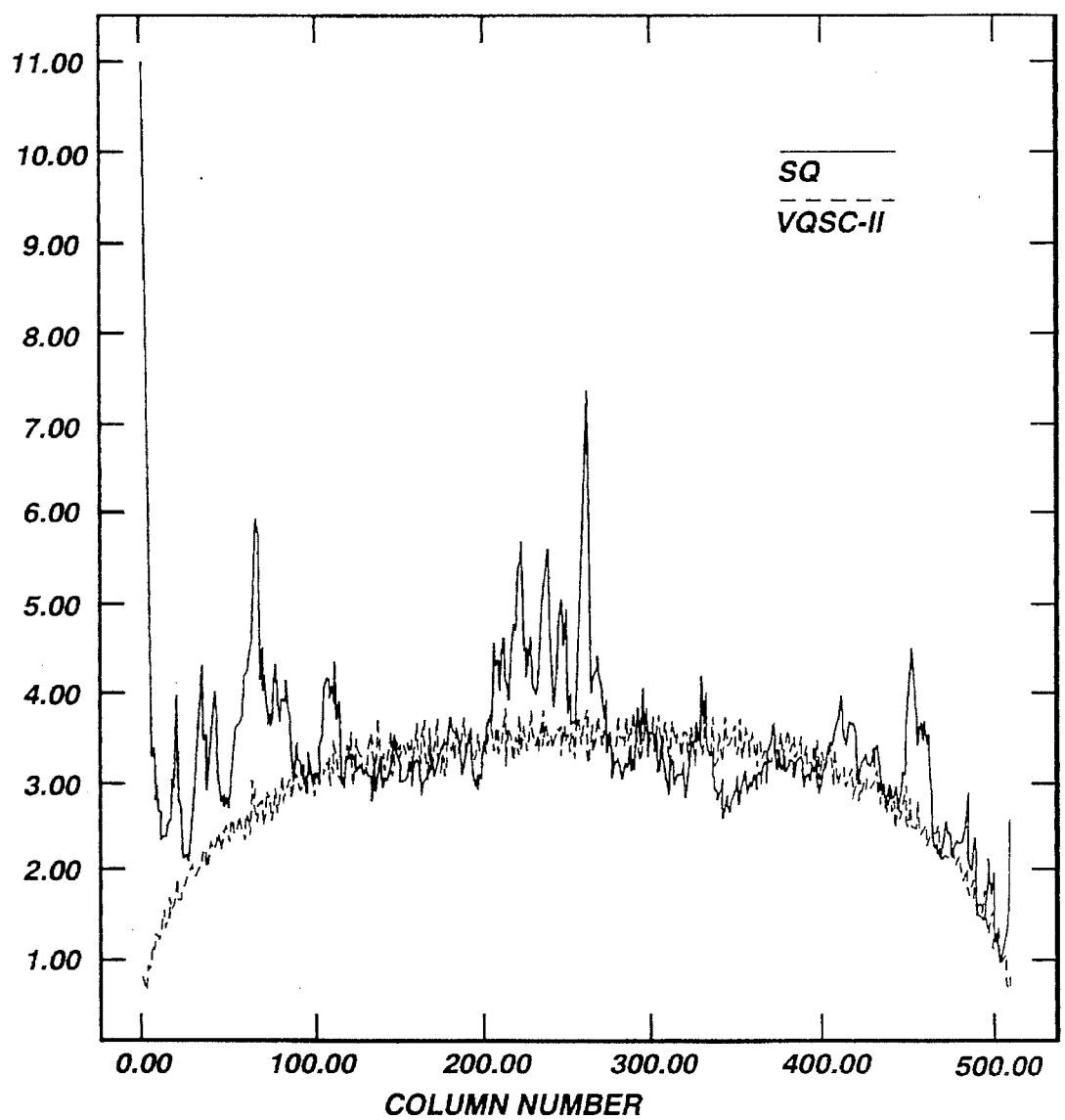
FIG. 18 is a graph showing average error versus column number for CT images of VQSC and SQ.

In order to visually demonstrate that VQSC-I is superior to SQ, the average error versus column number for MR, DR, and CT images were computed. These results are illustrated in FIGS. 9, 10, and 11, in each of which cases the maximum errors Max $Err_{VQSC-I}$ and Max $Err_{SC}$ are each 7 and VQSC has fewer bits per sample than SQ. These results show that for each image the average error at each column of VQSC-I is less than or equal to that of SQ. Accordingly, VQSC-I is superior to SQ.

In summary, the simulation results show that the fixed quality source coder has a smaller MAE, RMSE and data rate than the traditional coder, while maintaining the same maximum error.

A comparison of the second embodiment of the invention is described in connection with FIG. 12. Referring to FIG. 12, an interpolator 110 receives signal $I_{D0}$ from the traditional source coder of FIG. 1. Interpolator 110 provides the signal $I_{INT}$ through, for example, (1) linear interpolation, (2) cubic interpolation, or (3) increasing the number of samples/frame by, for example, repeating each pixel twice in a line and repeating each line. Interpolator 110 reconstructs the rxs samples/frame image into RxS samples/frame image. The resulting signal $I_{INT}$ has RxS samples/frame and may be compared with signal $I_{RD2}$ of fixed quality source coder 20 in FIG. 11.

Referring to FIG. 11, in order to compare the performance of the SQ with VQSC-II, each frame of the analog image is sampled by S/H 22 with a resolution of RxS samples. Then, each sample is quantized into an n-bit digital signal by ADC 16. This RxS n-bit digital signal $I_{D2}$ is assumed to be the original signal. See FIG. 12. This signal is low pass filtered by low pass filter 12 and sub-sampled into rxs samples/frame and to obtain the output of the SQ. The output with n-bit rxs samples/frame is the same $I_{D0}$ of FIG. 1. These rxs samples of the digital signal are reconstructed into RxS samples by interpolator 110 and constitute the digital signal of the larger frame.

The MAE and RMSE between the original signal and the reconstructed signal of the SQ can be evaluated. MAE and RMSE between the original signal and the output of the VQSC-II are also evaluated.

The same test images used in connection with the VQSC-I simulation described above were also used in connection with VQSC-II. The original signals were low pass filtered and 2:1 sub-sampled as the output of SQ. The low pass filtering and sub-sampling processes were actually done by taking the average of each two consecutive pixels to represent one pixel. The output of SQ was up-sampled and filtered (by a cubic spline interpolation) to obtain the reconstructed image. The MAE and RMSE between the SQ reconstructed image and the original image were evaluated and are shown in the table of FIG. 15.

The original images were also coded by using fixed quality source coder 20, as shown in FIG. 11. Measured values of $MAE_{VQSC-II}$ and $RMSE_{VQSC-II}$ and Max Error-$_{VQSC-II}$ are provided in the table of FIG. 14 for particular images and bits per pixel.

The table of FIG. 13 shows measured $MAE_{SQ}$, $RMSE_{SQ}$, and Max $Error_{SQ}$ for the traditional source coder of FIG. 1 for MR, DR, and CT images for particular bits per pixel.

The table of FIG. 15 shows that the compression ratio MAER, and RMSER of VQSC-II are always greater than one and, therefore, less than those of SQ. That is, VQSC-II always has fewer bits per sample, and a smaller MAE and RMSE than does SQ. VQSC-II also has a smaller max error. Thus, in every case simulated, VQSC-II is a superior quantizer than is SQ.

A comparison circuit for the circuit of FIG. 19 would be analogous to those of FIGS. 3 and 12.

In comparison with the traditional source coder, the present invention allows (1) improved quality with the same storage requirements, (2) improved storage requirements with the same quality, (3) some improvement in both quality and storage, or (4) some other tradeoff in quality and storage requirements.

The present invention is not limited to any particular video standard. The use of the term "conductor" in the singular is used several times with reference to the circuits of the figures. This is not to imply that there could not be parallel conductors to transmit data in parallel. For example, conductor 18 could comprise more than one individual conductor.

The present invention may be embodied in specific forms other than those of the preceding description, which are to be considered only as illustrative and not restrictive. Accordingly, the scope of the invention is indicated by the following claims, including equivalents thereof, rather than by the specific embodiments described in the preceding description.

What is claimed is:

1. A fixed quality source coder for encoding a digital signal $I_D$ which comprises a first series of separate data respectively representing multiple pixels, the coder comprising:

codec means receiving the signal $I_D$ for encoding the signal $I_D$ to provide encoded information regarding the signal $I_D$ and for decoding the encoded signal to produce a decoded signal $I_{VQ}^{-1}$ which comprises a second series of separate data respectively representing the multiple pixels;

means for determining an error signal $E_R$ which comprises a third series of separate data that is the result of a comparison of the first series of separate data and the second series of separate data for each of the multiple pixels;

threshold means receiving the signal $E_R$ for passing a truncated error signal $E_T$ for each of the multiple pixels based on a comparison of $E_R$ and fixed threshold value T; and lossless encoder means for receiving and encoding the signal $E_T$ to provide a signal $\bar{E}_T$.

2. The coder of claim 1 in which the threshold value T is selected by a user.

3. The coder of claim 1, further comprising:

multiplexing means that receives the signal $\bar{E}_T$ and the encoded information regarding the signal $I_D$ for multiplexing the signal $\bar{E}_T$ and the encoded information regarding the signal $I_D$ to provide a multiplexed signal responsive to the signal $\bar{E}_T$ and the encoded information regarding the signal $I_D$;

demultiplexing means that receives the multiplexed signal for providing a demultiplexed signal responsive thereto; and decoding means that receives the demultiplexed signal for providing a decoded signal $I_{RD}$ responsive thereto, which is a reconstruction of the signal $I_D$, wherein a difference between the signal $I_D$ and the decoded signal $I_{RD}$ less than the threshold T.

4. The coder of claim 1 in which the signal $I_D$ has n+k bits and the fixed quality source coder has a maximum error that is no greater than that of the n-bit analog to digital converter, but with an average error and a data rate that are substantially smaller than that of the n-bit analog to digital converter.

5. The coder of claim 1 in which the signal $I_D$ has RxS samples/frame and the fixed quality source coder has a maximum error that is no greater than that of a signal having rxs samples/frame where R is larger than r and S is larger than s, but with an average error and a data rate that are substantially smaller than that of the signal having rxs samples/frame.

6. The coder of claim 1 in which the signal $I_D$ has n+k bits and threshold T is equal to the least significant bit of an n-bit analog-to-digital converter.

7. The coder of claim 1 in which the codec means includes a lossy encoder that performs multi-stage tree adaptive search vector quantization.

8. The coder of claim 1 in which $E_R = I_D - I_{VQ}^{-1}$.

9. The coder of claim 1 in which $E_T = E_R - T$ when $E_R > T$, $E_T = 0$ when $-T \leq E_R \leq T$, and $E_T = E_R + T$ when $E_R < -T$.

10. The coder of claim 1 in which $E_T = E_R - T$ when $E_R \geq T$, $E_T = 0$ when $-T \leq E_R < T$, and $E_T = E_R + T$ when $E_R < -T$.

11. The coder of claim 1 in which $E_T = E_R - T$ when $E_R > T$, $E_T = 0$ when $-T < E_R \leq T$, and $E_T = E_R + T$ when $E_R \leq -T$.

12. The coder of claim 1 in which $E_T = E_R - T$ when $E_R \geq T$, $E_T = 0$ when $-T < E_R < T$, and $E_T = E_R + T$ when $E_R \leq -T$.

13. A fixed quality source coder for encoding a digital signal $I_D$, the coder comprising:

a codec that receives and encodes the signal $I_D$ to provide encoded information regarding the signal $I_D$ and decodes the encoded signal to produce a decoded signal $I_{VQ}^{-1}$;

means for determining an error signal $E_R$ by comparing the signal $I_D$ and decoded signal $I_{VQ}^{-1}$;

a threshold circuit that receives the signal $E_R$ and passes a truncated error signal $E_T$ based on a fixed threshold value T; and a lossless encoder that receives and encodes the signal $E_T$ to provide a signal $\overline{E}_T$.

14. The coder of claim 13 in which the threshold value T is selected by a user.

15. The coder of claim 13, further comprising:

a multiplexer that receives the signal $\overline{E}_T$ and the encoded information regarding the signal $I_D$ for multiplexing the signal $\overline{E}_T$ and the encoded information regarding the signal $I_D$ to provide a multiplexed signal responsive to the signal $\overline{E}_T$ and the encoded information regarding the signal $I_D$;

a demultiplexer that receives the multiplexer signal and provides a demultiplexed signal responsive thereto; and a decoder that receives the demultiplexed signal and provides a decoded signal $I_{RD}$ responsive thereto, which is a reconstruction of the signal $I_D$.

16. The coder of claim 13 in which the signal $I_D$ has n+k bits and the fixed quality source coder has a maximum error that is no greater than that of the n-bit analog to digital converter, but with an average error and a data rate that are substantially smaller than that of the n-bit analog to digital converter.

17. The coder of claim 13 in which the signal $I_D$ has RxS samples/frame and the fixed quality source coder has a maximum error that is no greater than that of a signal having rxs samples/frame where R is larger than r and S is larger than s, but with an average error and a data rate that are substantially smaller than that of the signal having rxs samples/frame.

18. The coder of claim 13 in which the codec is a lossy codec and includes a lossy encoder.

19. The coder of claim 13 in which $E_R = I_D - I_{VQ}^{-1}$.

20. The coder of claim 13 in which $E_T = E_R - T$ when $E_R > T$, $E_T = 0$ when $-T \leq E_R \leq T$, and $E_T = E_R + T$ when $E_R < -T$.

* * * * *

UNITED STATES PATENT AND TRADEMARK OFFICE
CERTIFICATE OF CORRECTION

PATENT NO. : 5,541,594
DATED : July 30, 1996
INVENTOR(S) : Huang et al.

It is certified that error appears in the above-indentified patent and that said Letters Patent is hereby corrected as shown below:

In col. 5, line 14, insert a period after "19";

In col. 7, line 18, delete the period after "distortion";

In col. 8, line 53, after "in" delete "the";

In col. 11, line 18, after "are" delete "each"; and

In col. 13, line 8, after "$I_{RD}$" insert --is--.

Signed and Sealed this

Eleventh Day of February, 1997

Attest:

BRUCE LEHMAN

Attesting Officer     Commissioner of Patents and Trademarks